(12) United States Patent
Nagano et al.

(10) Patent No.: US 7,106,046 B2
(45) Date of Patent: Sep. 12, 2006

(54) CURRENT MEASURING METHOD AND CURRENT MEASURING DEVICE

(75) Inventors: Shuichi Nagano, Numazu (JP); Kazutoshi Ishibashi, Fuji (JP); Koji Shibahara, Machida (JP)

(73) Assignee: Asahi Kasei EMD Corporation, Tokyo (JP)

( * ) Notice: Subject to any disclaimer, the term of this patent is extended or adjusted under 35 U.S.C. 154(b) by 6 days.

(21) Appl. No.: 10/518,396

(22) PCT Filed: Jun. 13, 2003

(86) PCT No.: PCT/JP03/07579

§ 371 (c)(1),
(2), (4) Date: Dec. 17, 2004

(87) PCT Pub. No.: WO03/107018

PCT Pub. Date: Dec. 24, 2003

(65) Prior Publication Data

US 2006/0033487 A1     Feb. 16, 2006

(30) Foreign Application Priority Data

Jun. 18, 2002   (JP) ............................. 2002-177681

(51) Int. Cl.
*G01R 15/20* (2006.01)
(52) U.S. Cl. ................................. 324/117 H
(58) Field of Classification Search .................... None
See application file for complete search history.

(56) References Cited

U.S. PATENT DOCUMENTS

| | | | | |
|---|---|---|---|---|
| 4,937,251 A | * | 6/1990 | Lunts | ........................ 514/351 |
| 5,216,405 A | * | 6/1993 | Schroeder et al. | ........ 338/32 R |
| 5,942,895 A | * | 8/1999 | Popovic et al. | ............. 324/251 |
| 6,040,690 A | * | 3/2000 | Ladds | ........................ 324/142 |
| 6,545,462 B1 | * | 4/2003 | Schott et al. | ............. 324/207.2 |
| 6,819,095 B1 | * | 11/2004 | Dubhashi et al. | ........ 324/117 H |
| 2002/0011841 A1 | | 1/2002 | Goto et al. | |

FOREIGN PATENT DOCUMENTS

| | | |
|---|---|---|
| EP | 1 031 844 A2 | 8/2000 |
| JP | 61-080074 | 4/1986 |
| JP | 8-35993 | 2/1996 |
| JP | 8-178965 | 7/1996 |
| JP | 08-233865 | 9/1996 |
| JP | 10-267965 | 10/1998 |

* cited by examiner

*Primary Examiner*—Vinh Nguyen
*Assistant Examiner*—Richard Isla-Rodas
(74) *Attorney, Agent, or Firm*—Finnegan, Henderson, Farabow, Garrett & Dunner, L.L.P.

(57) ABSTRACT

A current measuring method capable of reducing the size of a current sensor while ensuring electric insulation easily and suitable for enhancing reliability by preventing heat generation. A current measuring device comprises a printed board (3) having a conductor for measurement (4), and a noncontact current sensor (100) being mounted on the printed board (3), wherein the current sensor (100) is mounted on the surface (92) of the printed board (3) opposite to the side provided with the conductor for measurement (4). Since the current sensor (100) is mounted on the rear surface (92), electric insulation between the secondary conductor of the current sensor (100) and the conductor for measurement (4) can be ensured relatively easy.

20 Claims, 9 Drawing Sheets

CURRENT MEASURING METHOD AND CURRENT MEASURING DEVICE

This application is a 371 of PCT/JP03/07579 Jun. 13, 2003.

TECHNICAL FIELD

The present invention relates to a method and device for measuring a current flowing through a conductor for measurement on a board by use of a current sensor mounted on the board and, particularly, to a current measuring method and a current measuring device that easily ensure electric insulation, can reduce the size of a current sensor and are suitable for improving reliability by preventing heat generation.

BACKGROUND ART

As techniques for measuring a current on a printed board, those using a shunt resistor, a magnetoresistive element or a Hall element have hitherto been widely known.

As techniques for measuring a current by use of a Hall element, there have been known, for example, a current detecting unit disclosed in the Japanese Patent Laid-Open No. 8-233865 (hereinafter referred to as the first conventional example), a current measuring method using a current sensor disclosed in the Japanese Patent Laid-Open No. 10-267965 (hereinafter referred to as the second conventional example), and a current measuring method using a current sensor disclosed in the U.S. Pat. No. 5,942,895 (hereinafter referred to as the third conventional example).

The first conventional example comprises a printed board, on one side of which a concavity is formed and from the other side of which a hole that communicates with this concavity is provided, a magnetic sensor disposed on or in the hole on one side, a coil section provided in the upper part of the printed board, a first magnetic material core that is provided in the upper part of the coil and has a projection on the side opposite to the magnetic sensor, and a second magnetic material core that is provided in the concavity so as to be opposite to the magnetic sensor. By connecting the coil section of the current detection unit directly to the current conductor on the printed board, the efficiency of current detection is high and a structure that permits surface mounting is provided.

The second conventional example comprises a conductor through which a current to be measured is caused to flow, a thin piece of magnetic material, and a magneto-electric transducer. A flat convexity is provided in the middle of the conductor and the magneto-electric transducer is fixed to the inner side of the lower part of the convexity so as to be perpendicular to a current to be measured. A thin piece of magnetic material to cause a magnetic field generated by the current to be concentrated at the magneto-electric transducer is provided. By mounting the conductor of the current sensor that is to be measured and the current conductor on the printed board, which are connected in series, on the board, it is possible to realize a high-efficiency current sensor capable of shutting off foreign noise.

As seen in these conventional examples, a current conductor that is provided with in a current sensor (hereinafter referred to as a primary side current conductor) and a current conductor that is provided on a printed board and becomes an object of measurement (hereinafter referred to as a conductor for measurement) a redirectly connected in series, and letting a current flow through the primary side current conductor is a common way to measure the current flowing through the conductor for measurement with high accuracy. This method has been widely adopted.

Also, in a current measuring method using a shunt resistor, the shunt resistor and a conductor for measurement are directly connected in series, letting a current flow to the shunt resistor causes generating of drop, and the current flowing through the conductor for measurement is measured with high accuracy by measuring the potential difference.

Furthermore, in the latest technology, there have been devised methods of measuring a current in a noncontact manner by sticking a high-sensitivity magnetic sensor such as GMR to a current conductor.

However, because in the first to third conventional examples, the primary side current conductor and the conductor for measurement are directly connected, it is necessary to ensure sufficient electric insulation between a signal line that is provided within the current sensor and used to output sensor signals (hereinafter referred to as the secondary side current conductor) and the conductor for measurement, posing the problem that there are given restrictions to the mounting of the current sensor. When electric insulation is not sufficient, there is a possibility that noise and excessive input may be transmitted to the side of a circuit that uses sensor signals from the current sensor. Also, when a current flowing through the conductor for measurement is large, it is necessary to increase the size of the primary side current conductor to adapt to the large current, posing the problem that the current sensor becomes large in size. Furthermore, when the primary side current conductor and the conductor for measurement are directly connected, heat is generated because a current flows through a contact resistor in the connection part, posing the problem that there is a possibility that if the calorific value is large, the reliability of the current sensor may be impaired.

Similarly, in a current measuring method using a shunt resistor, it is impossible to ensure electric insulation between a signal line to output sensor signals and the conductor for measurement, posing the problem that there are given restrictions to the mounting. Also, when a current flowing through the conductor for measurement is large, it is necessary to increase the size of a heat sink of the shunt resistor to adapt to the large current, posing the problem that the current sensor becomes large in size. Furthermore, when the shunt resistor and the conductor for measurement are directly connected, heat is generated because a current flows through the resistor, posing the problem that there is a possibility that if the calorific value is large, the reliability of the current sensor may be impaired. Moreover, because in the case of the shunt resistor, selection is required it is necessary to have a precise resistance value.

Furthermore, noncontact current measuring methods by the latest high-sensitivity magnetic sensor such as GMR pose the problems that sufficient accuracy cannot be ensured because the magnetic hysteresis is large, and that attaching accuracy is severe, the mounting place is limited and the direction of a current cannot be detected because it is necessary to use a bias magnet.

Therefore, the present invention was made by paying attention to such unsolved problems in the conventional techniques and has as its object the provision of a current measuring method and a current measuring device that easily ensure electric insulation, can reduce the size of a current sensor and are suitable for improving reliability by preventing heat generation.

DISCLOSURE OF THE INVENTION

To achieve the above-described object, the current measuring method according to claim 1 related to the invention is a current measuring method that involves mounting a current sensor on a board having a conductor for measurement and measuring a current flowing through the conductor for measurement, which is characterized in that the current sensor is mounted on a surface of the board on the side that is opposite to the side provided with the conductor for measurement, that the current sensor has a Hall element that detects magnetic fields and magnetic flux concentrating means that causes a magnetic flux to be concentrated in a predetermined direction, and that the magnetic flux concentrating means is provided in such a manner that a magnetic flux generated by a current flowing through the conductor for measurement is concentrated on a magnetic flux sensing surface of the Hall element.

It should be noted here that measuring a current includes obtaining the magnitude of a current flowing through a conductor for measurement, detecting whether a current exists, and whether a current value exceeds a prescribed value. The same applies hereinafter to the current measuring device according to claim 10.

Furthermore, the aspect of the current measuring method according to claim 2 related to the invention is that in the current measuring method according to claim 1 related to the invention, the current sensor is mounted on a surface of the board on the side that is opposite to the side provided with the conductor for measurement and in a position symmetrical to the conductor for measurement with respect to the board.

Furthermore, the aspect of the current measuring method according to claim 3 related to the invention is that in the current measuring method according to either claim 1 or claim 2, a soft magnetic material is provided on an exterior surface of the conductor for measurement on the side that is opposite to an exterior surface facing the surface of the board.

Furthermore, the aspect of the current measuring method according to claim 4 related to the invention is that in the current measuring method according to either claim 1 or claim 2, a soft magnetic material is provided on an exterior surface of the current sensor on the side that is opposite to an exterior surface facing the surface of the board.

Furthermore, the aspect of the current measuring method according to claim 5 related to the invention is that in the current measuring method according to either claim 1 or claim 2, between the current sensor and the board, there are provided multiple soft magnetic materials so as to be parallel to the direction of a current flowing through the conductor for measurement.

Furthermore, the aspect of the current measuring method according to claim 6 related to the invention is that in the current measuring method according to any one of claims 1 to 5, the current sensor integrally incorporates the Hall element and the magnetic flux concentrating means and that the magnetic flux concentrating means is provided between the Hall element and the facing surface.

Furthermore, the aspect of the current measuring method according to claim 7 related to the invention is that in the current measuring method according to 6, the magnetic flux concentrating means comprises multiple magnetic flux concentrating plates and is provided in such a manner that when the current sensor is mounted, surfaces of the magnetic flux concentrating plates are facing the surface of the board.

Furthermore, the aspect of the current measuring method according to claim 8 related to the invention is that in the current measuring method according to claim 7, the multiple magnetic flux concentrating plates are spaced in such a manner that when the current sensor is mounted, surfaces of the magnetic flux concentrating plates are opposite to the surface of the board and the multiple magnetic flux concentrating plates are positioned on both sides of a centerline of the conductor for measurement as viewed from the direction perpendicular to the plane of the board.

Furthermore, the aspect of the current measuring method according to claim 9 related to the invention is that in the current measuring method according to any one of claims 1 to 8, the conductor for measurement is a printed wiring and that the board is a printed board.

On the other hand, to achieve the above-described object, the current measuring device according to claim 10 related to the invention is a current measuring device, which is characterized in that the device comprises a board having a conductor for measurement and a current sensor to be mounted on the surface of the board, and measures a current flowing through the conductor for measurement, that the current sensor is mounted on the surface of the board on the side that is opposite to the side provided with the conductor for measurement, that the current sensor has a Hall element that detects magnetic fields and magnetic flux concentrating means that concentrates a magnetic flux in a predetermined direction, and that the magnetic flux concentrating means is provided in such a manner that a magnetic flux generated by a current flowing through the conductor for measurement is concentrated on a magnetic flux sensing surface of the Hall element.

According to this construction, when a current is flowing through the conductor for measurement, a magnetic field is generated by the current flowing through the conductor for measurement, the generated magnetic field reaches the surface of the board on the side that is opposite to the side of the conductor for measurement, and the current flowing through the conductor for measurement is measured in a noncontact manner by the current sensor, which receives the magnetic field that has reached the opposite side of the board. Therefore, by mounting the current sensor on the surface of the board on the side that is opposite to the side of the conductor for measurement, the current can be measured from the opposite side of the board.

Also, a magnetic flux generated by a current flowing through the conductor for measurement is concentrated on the magnetic flux sensing surface of the Hall element by the magnetic flux concentrating means and the magnetic flux that has been concentrated is transduced to voltage. Therefore, the current flowing through the conductor for measurement can be measured in a noncontact manner by an output voltage from the Hall element.

Furthermore, the aspect of the current measuring device according to claim 11 related to the invention is that in the current measuring device according to claim 10, the current sensor is mounted on the surface of the board on the side that is opposite to the side provided with the conductor for measurement and in a position symmetrical to the conductor for measurement with respect to the board.

According to this construction, a magnetic flux generated by a current flowing through the conductor for measurement can easily reach a position symmetrical to the conductor for measurement with respect to the board, which position is on the surface of the board on the side that is opposite to the conductor for measurement. Therefore, by providing the current sensor in this position, the magnetic flux generated by a current flowing through the conductor for measurement can be easily detected by use of the current sensor.

Furthermore, the aspect of the current measuring device according to claim 12 related to the invention is that in the current measuring device according to either claim 10 or claim 11, a soft magnetic material is provided on an exterior surface of the conductor for measurement on the side that is opposite to an exterior surface facing the surface of the board.

According to this construction, because a soft magnetic material is provided on an exterior surface of the conductor for measurement on the side that is opposite to an exterior surface facing the surface of the board, the magnetic flux generated by the current flowing through the conductor for measurement can be easily concentrated on the current sensor side by the soft magnetic material.

Furthermore, the aspect of the current measuring device according to claim 13 related to the invention is that in the current measuring device according to either claim 10 or claim 11, a soft magnetic material is provided on an exterior surface of the current sensor on the side that is opposite to an exterior surface facing the surface of the board.

According to this construction, because a soft magnetic material is provided on an exterior surface of the current sensor on the side that is opposite to an exterior surface facing the surface of the board, at least external magnetic fields that reach toward the surface of the current sensor on the opposite side are shielded by the soft magnetic material.

Furthermore, the aspect of the current measuring device according to claim 14 related to the invention is that in the current measuring device according to either claim 10 or claim 11, that between the current sensor and the board, there are provided multiple soft magnetic materials so as to be parallel to the direction of a current flowing through the conductor for measurement.

According to this construction, because multiple soft magnetic materials are provided between the current sensor and the board, the magnetic flux generated by the current flowing through the conductor for measurement can be easily concentrated on the current sensor side by the multiple soft magnetic materials.

Furthermore, the aspect of the current measuring device according to claim 15 related to the invention is that in the current measuring device according to either claim 10 or claim 11, the current sensor integrally incorporates the Hall element and the magnetic flux concentrating means and that the magnetic flux concentrating means is provided between the Hall element and the facing surface.

According to this construction, because the magnetic flux concentrating means is provided between the Hall element and the facing surface, the magnetic flux generated by the current flowing through the conductor for measurement can be easily received by the magnetic flux concentrating means. For this reason, the magnetic flux generated by the current flowing through the conductor for measurement can be effectively concentrated on the magnetic flux sensing surface of the Hall element.

Furthermore, the aspect of the current measuring device according to claim 16 related to the invention is that in the current measuring device according to claim 15, the magnetic flux concentrating means comprises multiple magnetic flux concentrating plates and is provided in such a manner that when the current sensor is mounted, surfaces of the magnetic flux concentrating plates are facing the surface of the board.

According to this construction, because the magnetic flux concentrating plates are provided so that surfaces of the magnetic flux concentrating plates are facing the surface of the board, the magnetic flux generated by the current flowing through the conductor for measurement can be easily received by the magnetic flux concentrating plates. For this reason, the magnetic flux generated by the current flowing through the conductor for measurement can be effectively concentrated on the magnetic flux sensing surface of the Hall element.

Furthermore, the aspect of the current measuring device according to claim 17 related to the invention is that in the current measuring device according to claim 16, the multiple magnetic flux concentrating plates are spaced in such a manner that when the current sensor is mounted, surfaces of the magnetic flux concentrating plates are facing the surface of the board and the magnetic flux concentrating plates are positioned on both sides of a centerline of the conductor for measurement as viewed from the direction perpendicular to the plane of the board.

According to this construction, because the magnetic flux concentrating plates are spaced so as to be positioned on both sides of a center line of the conductor for measurement as viewed from the direction perpendicular to the plane of the board, the magnetic flux received by the magnetic flux concentrating plates can be effectively concentrated on the magnetic flux sensing surface of the Hall element.

Furthermore, the aspect of the current measuring device according to claim 18 related to the invention is that in the current measuring device according to any one of claims 10 to 17, the board has multiple conductors to be measured and that the current sensor is mounted in a position where the distance of the board from each of the conductors to be measured is in a predetermined relation.

According to this construction, because the current sensor is mounted in a position where the distance of the board from each of the conductors to be measured is in a predetermined relation, when the magnetic flux generated by the current flowing through each of the conductors to be measured is received by the sensor, the current flowing through each of the conductors to be measured can be measured on the basis of an output value of the current sensor and the predetermined relation. The measurement of each current can be performed by computing, for example.

Furthermore, the aspect of the current measuring device according to claim 19 related to the invention is that in the current measuring device according to any one of claims 10 to 18, the conductor for measurement is a printed wiring and that the board is a printed board.

Furthermore, the aspect of the current measuring device according to claim 20 related to the invention is that in the current measuring device according to any one of claims 10 to 19, a magnetic flux sensing part of the Hall element is formed from Si, GaAs, InAs or InSb.

BEST MODE FOR CARRYING OUT THE INVENTION

Figure 1:
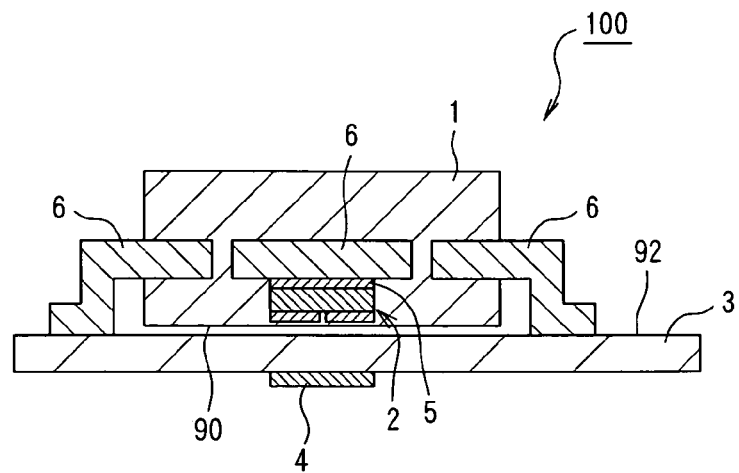
FIG. 1 is a sectional view of a current sensor 100 in the thickness direction.

The first embodiment of the invention will be described below by referring to the drawings. FIG. 1 to FIG. 12 show the first embodiment of the current measuring method and current measuring device related to the invention.

Figure 2:
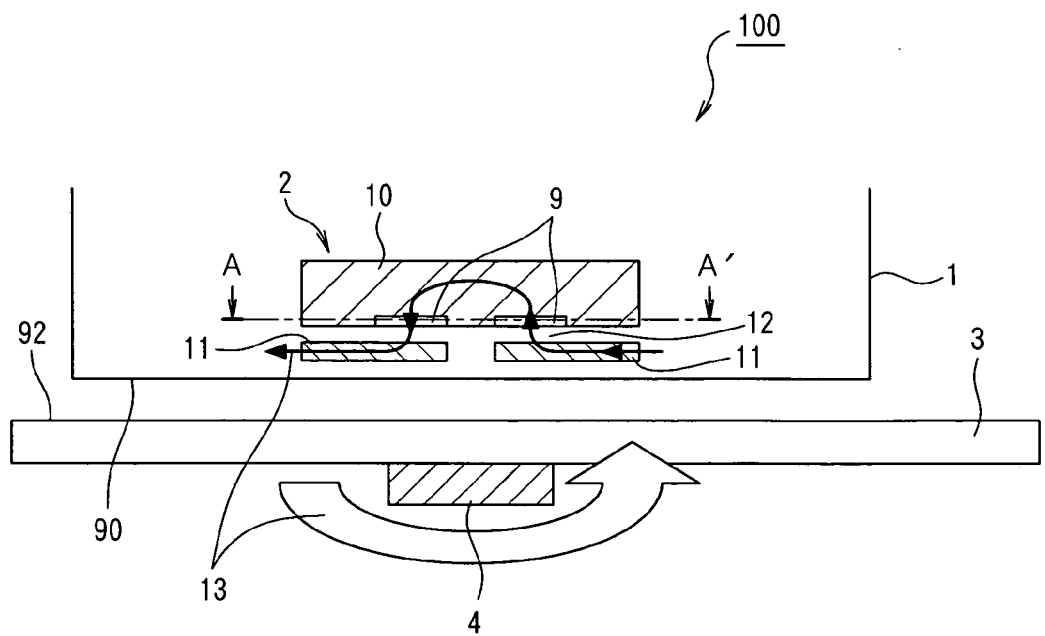
FIG. 2 is a sectional view of the current sensor 100 in the thickness direction.
Figure 3:
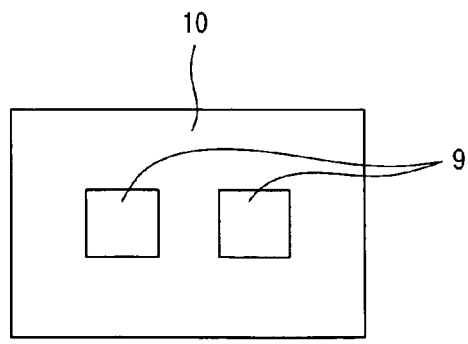
FIG. 3 is a sectional view taken along the line A–A' of FIG. 2.

First, descriptions will be given below by referring to FIG. 1 to FIG. 3 related to the invention. FIGS. 1 and 2 are each a sectional view of a current sensor 100 in the thickness direction. FIG. 3 is a sectional view taken along the line A–A' of FIG. 2.

As shown in FIGS. 1 and 2, a current measuring device related to the invention comprises a printed board 3 having a conductor for measurement 4 and a current sensor 100 to be mounted on the surface of the printed board 3, and the current sensor 100 is mounted on a surface 92 (hereinafter referred to simply as the rear surface) of the printed board 3 on the side that is opposite to the side provided with the conductor for measurement 4.

As shown in FIG. 1, the current sensor 100 is constructed so as to incorporate a Hall ASIC 2 having magnetic flux concentrating plates within a mold package 1. In the interior of the mold package 1, the Hall ASIC 2 having magnetic flux concentrating plates is provided on the side of an exterior surface 90 of the mold package 1 (hereinafter referred to simply as the facing surface) that faces the printed board 3 upon mounting.

The mold package 1 is provided with lead frames 6 to die bond the Hall ASIC 2 having magnetic flux concentrating plates. Ends of the lead frame 6 are bent so as to be capable of being mounted on the printed board 3. The Hall ASIC 2 having magnetic flux concentrating plates is bonded with an adhesive paste 5 to the lead frame 6 provided within the mold package 1.

As shown in FIGS. 2 and 3, the Hall ASIC 2 having magnetic flux concentrating plates is constructed by providing two Hall elements 9 on the exterior surface of a signal processing circuit 10 facing the printed board 3 upon mounting and by providing two magnetic flux concentrating plates 11 between the signal processing circuit 10 and the facing surface 90. If the Hall elements 9 are a pair of two sets, then two sets or more may be provided. The magnetic flux concentrating plates 11 are provided at prescribed intervals in optimum positions in which the surfaces of the magnetic flux concentrating plates 11 face the surface of the printed board 3 upon mounting and the magnetic flux concentrating plates 11 are positioned on both sides of a centerline of the projection of a conductor for measurement 4 on the sensor-mounted surface or at least come very close to the projection of a conductor for measurement 4 on the sensor-mounted surface. By spacing the magnetic flux concentrating plates 11, a magnetic flux generated by a current flowing through the conductor for measurement 4 is concentrated by the magnetic flux concentrating plates 11 on both sides on the magnetic flux sensing surface of the Hall element 9. Incidentally, the structure of the Hall ASIC 2 having magnetic flux concentrating plates is described in detail in the third conventional example.

The printed board 3 is formed from materials, such as paper phenol, paper epoxy and glass epoxy. Of course, the materials are not limited to them. However, if polyimide-base materials are used, this is good because the thickness of the printed board 3 can be reduced. Incidentally, although the thickness of the printed board 3 may be any size, the smallest possible size is preferable, because the smaller the thickness, the higher sensitivity of the sensor will be capable of being obtained. However, a necessary minimum is required in order to obtain insulating properties and the degree of freedom in mounting position.

The conductor for measurement 4 is a current conducting wire that is formed from metal foil of Cu, for example, and can be given an appropriate shape according to the value of a current flowing through the conductor for measurement 4 and the required current sensitivity. If the current value is large, the thickness of the conductor for measurement 4 is increased. When the current sensitivity is improved, the width of the conductor for measurement 4 is reduced. In order to keep the sensitivity of the sensor at an almost constant level, it is necessary only that the length of the conductor for measurement 4 be not less than a prescribed length. Incidentally, the width of the conductor for measurement 4 is a length that is along the plane direction of the printed board 3 and orthogonal to the direction of a current flowing through the conductor for measurement 4; the length of the conductor for measurement 4 is a length that is along the plane direction of the printed board 3, which length is in the direction of a current flowing through the conductor for measurement 4; and the thickness of the conductor for measurement 4 is a length along the direction orthogonal to the plane direction of the printed board 3. The same applies to the following.

Figure 4:
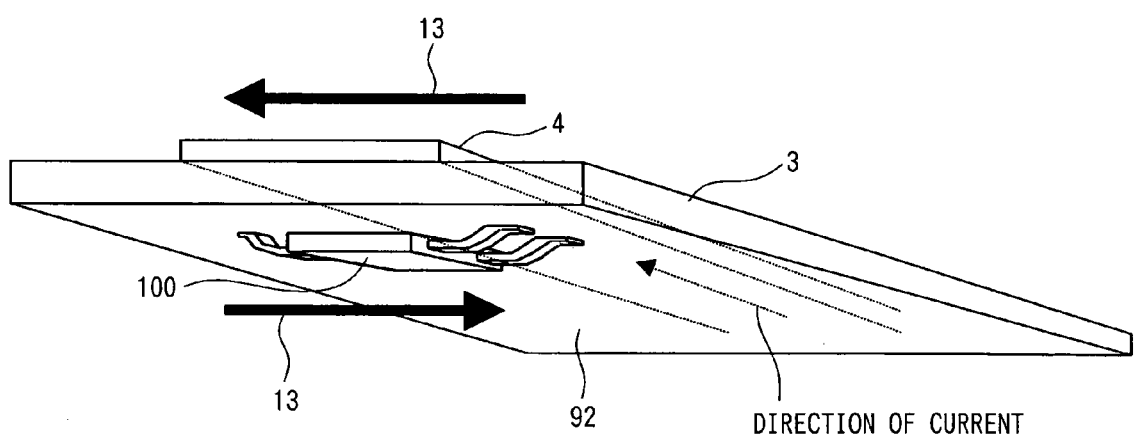
FIG. 4 is a perspective view of a case where the current sensor 100 is mounted on a printed board 3.

FIG. 4 is a perspective view of a case where the current sensor 100 is mounted on the printed board 3.

As shown in FIG. 4, the current sensor 100 is mounted on the rear surface 92 and in a position on the side that is opposite to the side provided with the conductor for measurement 4, the printed board 3 being positioned between the two. In this case, the condition of magnetic fields generated by a current flowing through the conductor for measurement 4 is as shown by the numerals 12 and 13 in FIG. 2 and the numeral 13 in FIG. 4. Below the Hall elements 9, the magnetic flux concentrating plates 11 are spaced at predetermined intervals so as to be parallel to the Hall elements 9. Therefore, when a current is flowing through the conductor for measurement 4 from the rear side in the drawing to the front side in the drawing, magnetic fields generated by the current are as indicated by the numeral 13 in FIGS. 2 and 4, and in particular, the magnetic field near the Hall elements 9 is concentrated by magnetic flux concentrating plates 11 as indicated by the numeral 12. As a result of this, the magnetic flux density of the magnetic flux sensing surfaces of the Hall elements 9 can be increased.

The signal processing circuit 10 performs the summing amplification of a Hall electromotive force obtained by the magnetoelectric transduction by the Hall elements 9. Incidentally, the Hall elements 9 and the signal processing circuit 10 need not always to be monolithically constructed as the Hall ASIC 2 having magnetic flux concentrating plates and may be constructed in a hybrid manner. Furthermore, current sensitivity can be further improved by using high-sensitivity Group IIIV compound semiconductors of InSb, InAs, GaAs, etc. in addition to Si as the material for the magnetic flux sensing part of the Hall element 9.

Thus, the current sensor 100 is constructed by integrally working the Hall ASIC 2 having magnetic flux concentrating plates and the lead frame 6 with a mold resin and has a structure suitable for mass production by a universal process.

Incidentally, the lead frame 6 is used in this embodiment. However, even when the lead frame 6 is not used, a flip chip may be adopted so long as the magnetic flux sensing surface of the Hall element 9 can come very close to the conductor for measurement 4 or come in contact therewith via an insulating layer and the current sensor 100 may be constructed as a flip chip bonding type. Also, in this case, the face down bonding type as in FIG. 1 may not be adopted and parts may be mounted in the order: magnetic flux concentrating plate, Hall element, board, current conductor. In this case, the parts need not always to be integrally worked with a mold resin. Furthermore, if a magnetic field parallel to the surface of the printed board 3 can be detected with performance equivalent to or more than the level of this embodiment, the current sensor 100 can be used in modes other than that described above.

EXAMPLES

Next, examples of the invention will be described by referring to FIG. 5 to FIG. 12.

A conductor for measurement 4 formed from copper coil 35 μm in thickness and 15 mm in width was formed on a printed board 3 having a thickness of 1.6 mm, and a current sensor 100 was mounted on a rear surface 92 and in a position symmetrical to the conductor for measurement 4 with respect to the printed board 3. This mounting enables sufficient electric insulation between the current sensor 100 and the conductor for measurement 4 to be ensured.

In the current sensor 100, a TSSOP-16 package that has generally found wide use was used as a mold package 1. The thickness of the mold package 1 was about 1 mm, and Hall elements 9 were disposed in positions about 300 μm from the bottom surface so as to come very close to the conductor for measurement 4 as far as possible. On the surface of the Hall element 9 were disposed multiple magnetic flux concentrating plates 11 formed from a soft magnetic material, thereby to provide the function of concentrating a magnetic flux parallel to a facing surface 90 on the Hall element 9. By subjecting a sensor signal obtained by the Hall element 9 to operation amplification by use of a signal processing circuit 10 built in the mold package 1, the current sensor 100 used can ensure a magnetic sensitivity of 160 mV/mT for the final current sensor 100 as a single unit. Although magnetic sensitivities up to 1600 mV/mT could be realized by changing the amplification rate of the signal processing circuit 10 or a magnetic circuit within the current sensor 100, in the invention the current sensor 100 having the magnetic sensitivity of 160 mV/mT was used as a standard current sensor.

Figure 5:
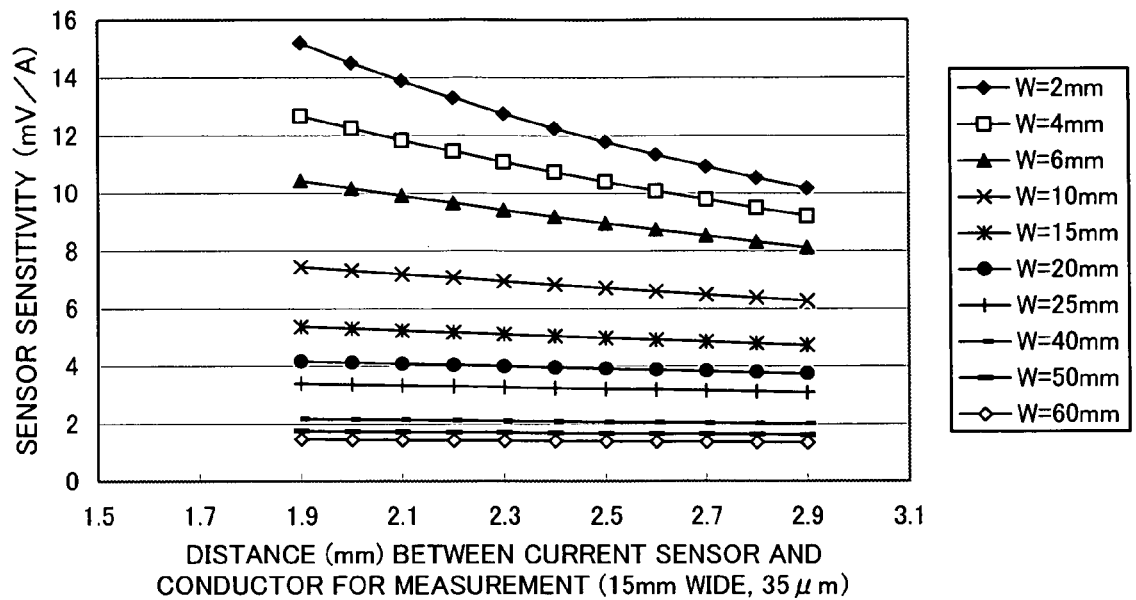
FIG. 5 is a graph that shows how the sensor sensitivity of the current sensor 100 changes when the distance between the current sensor 100 and a conductor for measurement 4 is changed.

FIG. 5 is a graph that shows how the sensor sensitivity of the current sensor 100 changes when the distance between the current sensor 100 and the conductor for measurement 4 is changed. However, the thickness of the conductor for measurement 4 is 35 μm and the distance of abscissa is the distance between the conductor for measurement 4 and the magnetic flux sensing part of the current sensor. In FIG. 5, changes in sensor sensitivity were investigated when the width W of the conductor for measurement 4 was 2 mm, 4 mm, 6 mm, 10 mm, 15 mm, 20 mm, 25 mm, 40 mm, 50 mm and 60 mm. According to the graph of FIG. 5, it is apparent that the smaller the distance between the current sensor 100 and the conductor for measurement 4 and the smaller the width W of the conductor for measurement 4, the more sensor sensitivity will be improved. Therefore, from the stand point of improving sensor sensitivity, it is preferred that the distance between the current sensor 100 and the conductor for measurement 4 be reduced and that the width W of the conductor for measurement 4 be reduced. On the other hand, when the width W of the conductor for measurement 4 is made large, changes in sensitivity become small even when the distance changes, providing the merit that uniform sensitivity is obtained with respect to changes in the distance.

Figure 6:
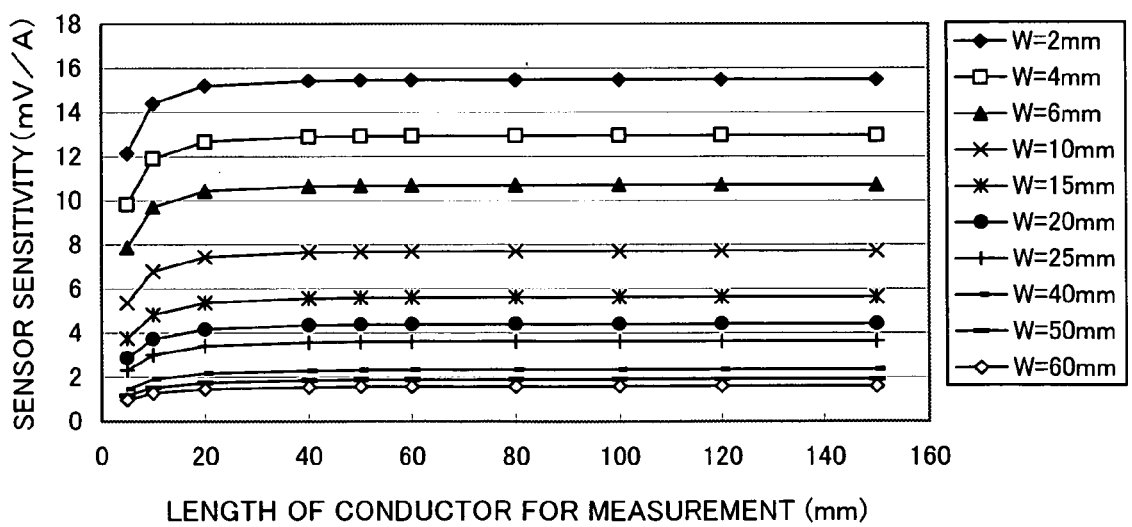
FIG. 6 is a graph that shows how the sensor sensitivity of the current sensor 100 changes when the length of the conductor for measurement 4 is changed.

FIG. 6 is a graph that shows how the sensor sensitivity of the current sensor 100 changes when the length of the conductor for measurement 4 is changed. However, the thickness of the conductor for measurement 4 was 35 μm and the thickness of the printed board 3 was 1.6 mm. The sensor sensitivity indicates values when the current sensor 100 is disposed in the center position of the conductor for measurement 4 as viewed from the direction perpendicular to the plane of the board. In FIG. 6, changes in sensor sensitivity were investigated when the width w of the conductor for measurement 4 was 2 mm, 4 mm, 6 mm, 10 mm, 15 mm, 20 mm, 25 mm, 40 mm, 50 mm and 60 mm. According to the graph of FIG. 6, it is apparent that the larger the length of the conductor for measurement 4 and the smaller the width W of the conductor for measurement 4, the more sensor sensitivity will be improved. However, for the length of the conductor for measurement 4, there is scarcely any change in sensor sensitivity when the length of the conductor for measurement 4 becomes larger than 10 mm at any width W. Therefore, from the standpoint of improving sensor sensitivity, it is preferred that the length of the conductor for measurement 4 be larger than 10 mm and that the width W of the conductor for measurement 4 be reduced.

Figure 7:
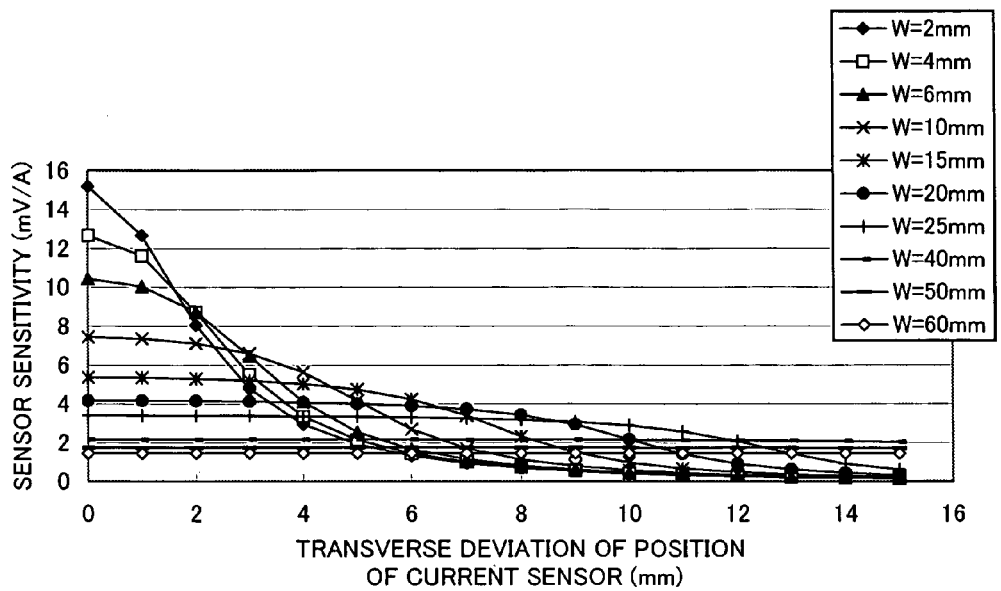
FIG. 7 is a graph that shows how the sensor sensitivity of the current sensor 100 changes when the mounting position of the current sensor 100 is changed in the width direction of the conductor for measurement 4 on the basis of a center position as viewed from the direction perpendicular to the plane of the conductor for measurement 4.

FIG. 7 is a graph that shows how the sensor sensitivity of the current sensor 100 changes when the mounting position of the current sensor 100 is changed in the width direction of the conductor for measurement 4 on the basis of a center position as viewed from the direction perpendicular to the plane of the conductor for measurement 4. However, the thickness of the conductor for measurement 4 was 35 μm and the thickness of the printed board 3 was 1.6 mm. In FIG. 7, changes in sensor sensitivity were investigated when the width W of the conductor for measurement 4 was 2 mm, 4 mm, 6 mm, 10 mm, 15 mm, 20 mm, 25 mm, 40 mm, 50 mm and 60 mm. According to the graph of FIG. 7, it is apparent that the nearer to the center position in the width direction of the conductor for measurement 4 the mounting position of the current sensor 100 and the narrower the width W of the conductor for measurement 4, the more sensor sensitivity will be improved. However, for the mounting position of the current sensor 100, a decrease in sensor sensitivity can be allowed depending on required measuring accuracy, if a deviation of the mounting position is up to ½ of the width W of the conductor for measurement 4, i.e., up to the vicinity of both ends of the conductor for measurement 4 when the conductor for measurement 4 is viewed in the width direction. This means that the current sensor 100 is not always disposed just under the conductor for measurement 4 and that the mounting position can be freely determined up to the vicinity of both ends of the conductor for measurement 4 when the conductor for measurement 4 is viewed in the width direction, and it is apparent that the degree of freedom of mounting is improved. Therefore, from the standpoint of improving sensor sensitivity, it is preferred that the mounting position of the current sensor 100 be brought close to the center position in the width direction of the conductor for measurement 4 and that the width W of the conductor for measurement 4 be reduced.

On the other hand, as shown in FIG. 7, the larger the width W of the conductor for measurement 4 the higher the uniformity of a magnetic field generated by the conductor for measurement 4 on the printed board 3, and by using the high-accuracy current sensor 100 of the invention, changes in sensitivity to deviations of the position in the transverse (X) direction become very small. In particular, when a current of more than several amperes is caused to flow, the width of the conductor for measurement 4 becomes more than several millimeters and, in this case, large sensitivity changes are not observed even when the mounting position deviates by not less than 1 mm in the transverse direction. Therefore, it becomes unnecessary to worry about deviations in the position of the current sensor 100 upon mounting. In conclusion, when a current sensitivity desired in terms of accuracy has been determined, the degree of freedom of the mounting position of the current sensor is increased by designing the width of the conductor for measurement 4 a little large without narrowing the width.

Figure 8:
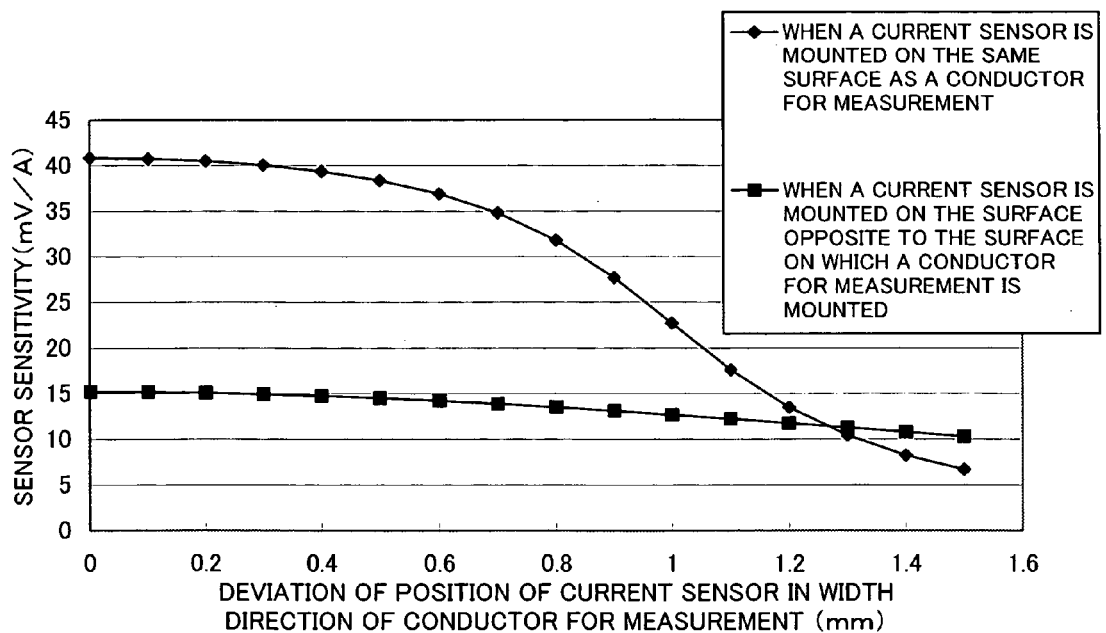
FIG. 8 is a graph that shows the relationship between the mounting position and sensitivity of the current sensor 100 when a conductor for measurement 4 having a width of 2 mm is used.
Figure 9:
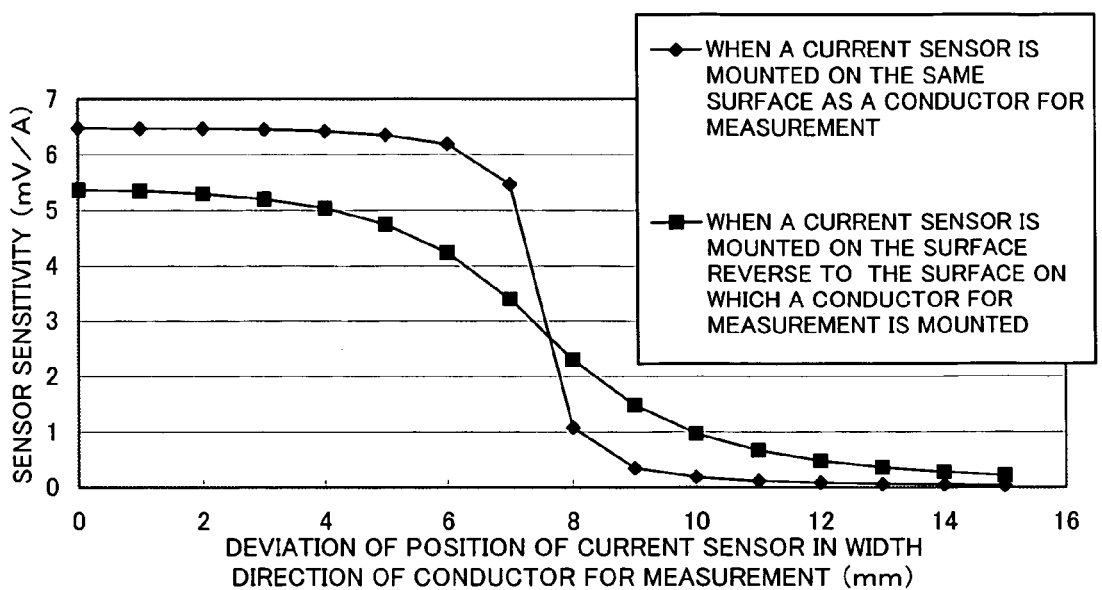
FIG. 9 is a graph that shows the relationship between the mounting position and sensitivity of the current sensor 100 when a conductor for measurement 4 having a width of 15 mm is used.

FIG. 8 is a graph that shows the relationship between the mounting position and sensitivity of the current sensor 100 when the conductor for measurement 4 has a width of 2 mm. FIG. 9 is a graph that shows the relationship between the mounting position and sensitivity of the current sensor 100 when the conductor for measurement 4 has a width of 15 mm. However, in both FIG. 8 and FIG. 9, the thickness of the conductor for measurement 4 was 35 μm and the thickness of the printed board 3 was 1.6 mm. In both figures, deviations in position are those in the transverse direction of the conductor for measurement 4 from the center position of the conductor for measurement 4 as viewed from the direction perpendicular to the plane of the board.

Furthermore, it can be said from FIG. 7 that the highest current sensitivity is obtained when the deviation between the current sensor 100 and the conductor for measurement 4 is zero. However, even when there is a deviation of position to a certain degree, in a case where the deviation is to an extent corresponding to the width of the conductor for measurement 4, the rate of change in sensitivity is a gentle one even compared to the case of the surface mounting in which the current sensor is mounted on the same side as provided with the conductor for measurement 4. Even when a deviation of position corresponding to about half the width of the conductor for measurement 4 occurs, it is possible to maintain not less than 50% of the maximum current sensitivity in a case where there is no deviation of position. Also, it is found that when the extent of a deviation of position corresponds to about the width of the conductor for measurement 4, changes in sensitivity to a deviation in position around the condition are small although a decrease in sensitivity is great. From this, it is apparent that a current can be measured with sufficient accuracy by mounting the current sensor 100 intentionally at a distance from near the end or the end of the conductor for measurement 4 (in a position moved in the width direction of the conductor for measurement 4). This means that by mounting the current sensor 100 on the surface reverse to the mounting surface of the conductor for measurement 4, it is possible to increase the degree of freedom of disposing the current sensor 100 with respect to the conductor for measurement 4, and this leads to greatly widening the degree of freedom of design for designers of circuit boards. The printed board 3 is thus configured so that the current in the conductor for measurement 4 on the surface opposing to the mounting surface thereof in a contactless manner, thereby ensuring insulation while improving the uniformity in magnetic field component parallel to the surface the printed board 3 and allowing the current sensor 100 to accurately measure the uniform magnetic field parallel to the surface of the printed board 3, which leads to the increase in the degree of the freedom of the mounting position.

Figure 10:
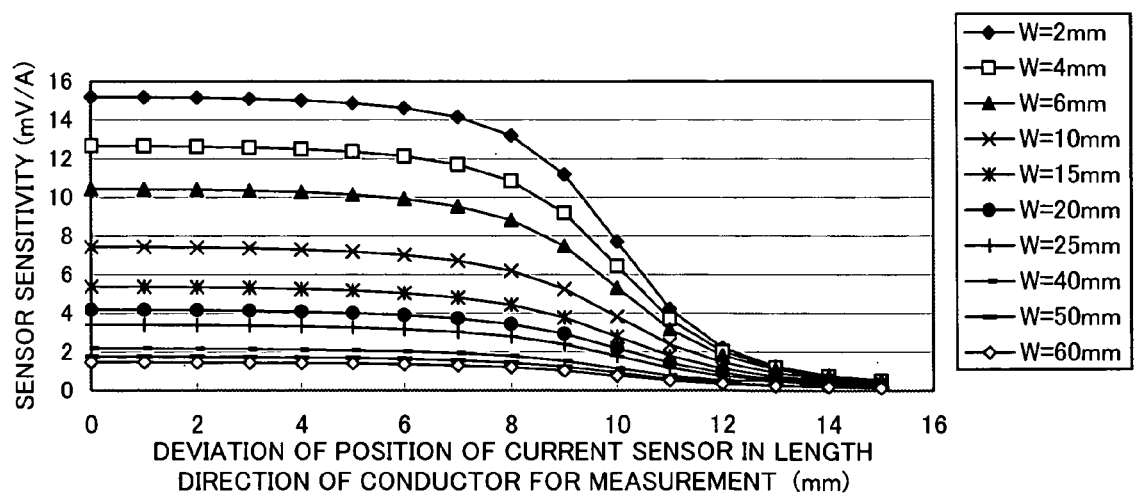
FIG. 10 is a graph that shows how the sensor sensitivity of the current sensor 100 changes when the mounting position of the current sensor 100 is changed in the length direction of the conductor for measurement 4 on the basis of a center position as viewed from the direction perpendicular to the plane of the conductor for measurement 4.

FIG. 10 is a graph that shows how the sensor sensitivity of the current sensor 100 changes when the mounting position of the current sensor 100 is changed in the length direction of the conductor for measurement 4 on the basis of a center position as viewed from the direction perpendicular to the plane of the conductor for measurement 4. However, the thickness of the conductor for measurement 4 was 35 μm, the thickness of the printed board 3 was 1.6 mm, and the length of the conductor for measurement 4 was 20 mm. In FIG. 10, changes in sensor sensitivity were investigated when the width W of the conductor for measurement 4 was 2 mm, 4 mm, 6 mm, 10 mm, 15 mm, 20 mm, 25 mm, 40 mm, 50 mm and 60 mm. According to the graph of FIG. 10, it is apparent that the nearer to the center position in the length direction of the conductor for measurement 4 the mounting position of the current sensor 100 and the smaller the width W of the conductor for measurement 4, the more sensor sensitivity will be improved. Therefore, from the standpoint of improving sensor sensitivity, it is preferred that the mounting position of the current sensor 100 be brought close to the center position in the length direction of the conductor for measurement 4 and that the width W of the conductor for measurement 4 be reduced.

Figure 11:
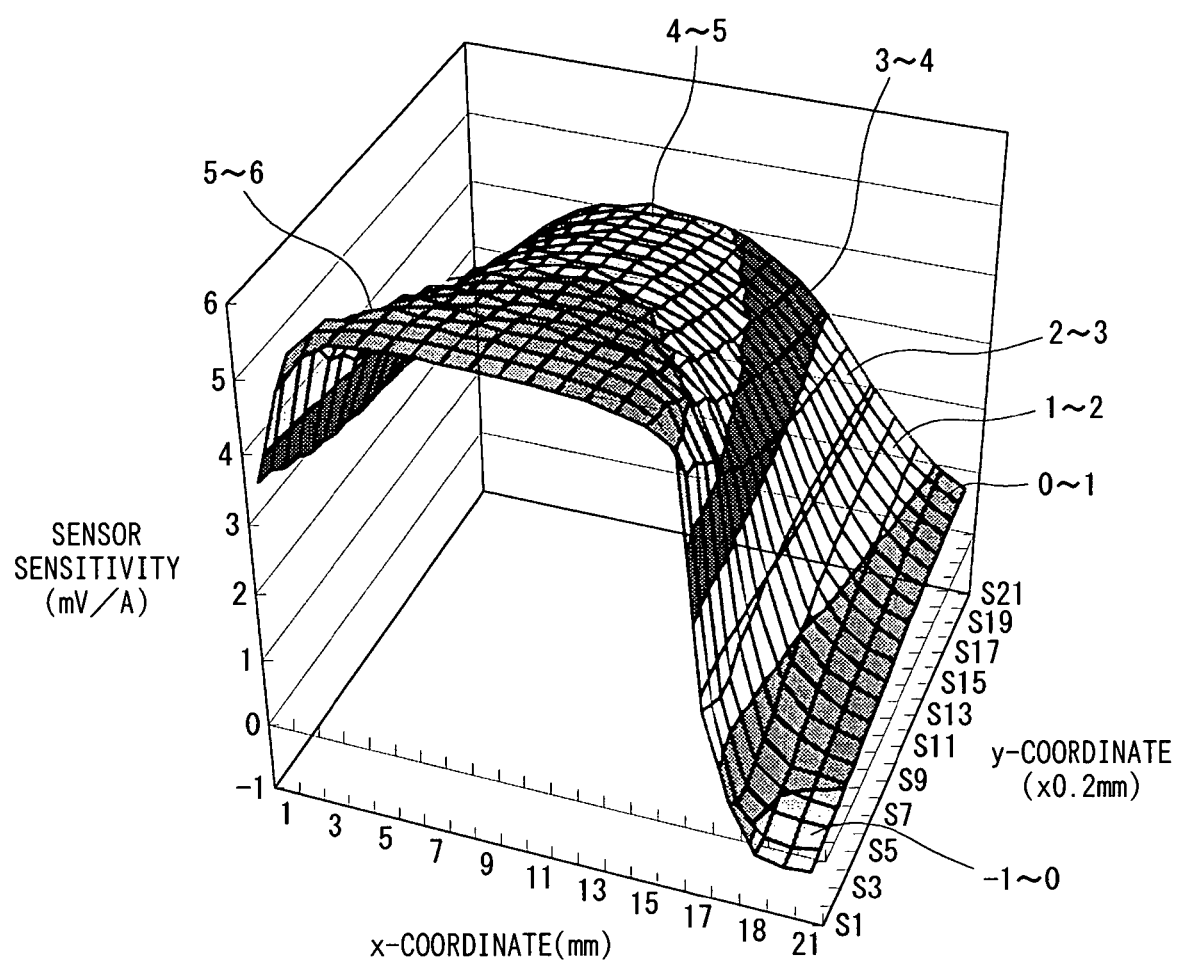
FIG. 11 is a graph that shows how the sensor sensitivity of the current sensor 100 changes when the mounting position of the current sensor 100 is changed in the width direction (X-coordinate) and thickness direction (Y-coordinate) of the conductor for measurement 4.

FIG. 11 is a graph that shows how the sensor sensitivity of the current sensor 100 changes when the mounting position of the current sensor 100 is changed in the width direction (x-coordinate) and thickness direction (y-coordinate) of the conductor for measurement 4. However, a condition in which the current sensor 100 is mounted on the 1.6 mm thick printed board 3 corresponds to a y-coordinate=0 mm, and the y-axis direction indicates in which the distance between the conductor for measurement 4 and the printed board 3 increases. An x-coordinate at which sensor sensitivity becomes a maximum corresponds to the center position of the conductor for measurement 4. FIGS. 5 and 7 are figures obtained when the graph of FIG. 11 is viewed from the x-axis direction and the y-axis direction.

Also, with reference to the graph of FIG. 5, when the conductor for measurement 4 is sufficiently wide for the thickness of the printed board 3, the rate of change in sensor sensitivity is small even when the distance between the current sensor 100 and the printed board 3 deviates a little, and this rate of change was about 1.3%/0.1 mm when the width W of the conductor for measurement was 15 mm. Furthermore, with reference to the graph of FIG. 7, also when the position of the current sensor 100 deviates in the transverse direction that forms 90° with the flow of a current flowing through the conductor for measurement 4, the change in sensor sensitivity was about 0.3%/1 mm when the width W of the conductor for measurement was 15 mm. Even when the length of the conductor for measurement 4 that is necessary for measuring the quantity of a current is not less than 20 mm, lengths that are not less than 20 mm have little effect on sensor sensitivity. For this reason, with reference to the graph of FIG. 6, it is necessary only that for the length of the conductor for measurement 4, a length of 20 mm or so be capable of being ensured, and this length is sufficient.

In a current measuring method according to this example, sensor sensitivity is determined by the shape and relative position of the conductor for measurement 4. The sensor sensitivity was 5.6 mV/A when a 15 mm wide conductor for measurement 4 was measured by the current sensor 100. The current sensor 100 can be sufficiently effective as a general current switch. Besides, if a high-sensitivity current sensor 100 is used, this current measuring method can improve sensor sensitivity about 10 times the sensor sensitivity of this current sensor 100 and can be sufficiently used in control applications.

Figure 12:
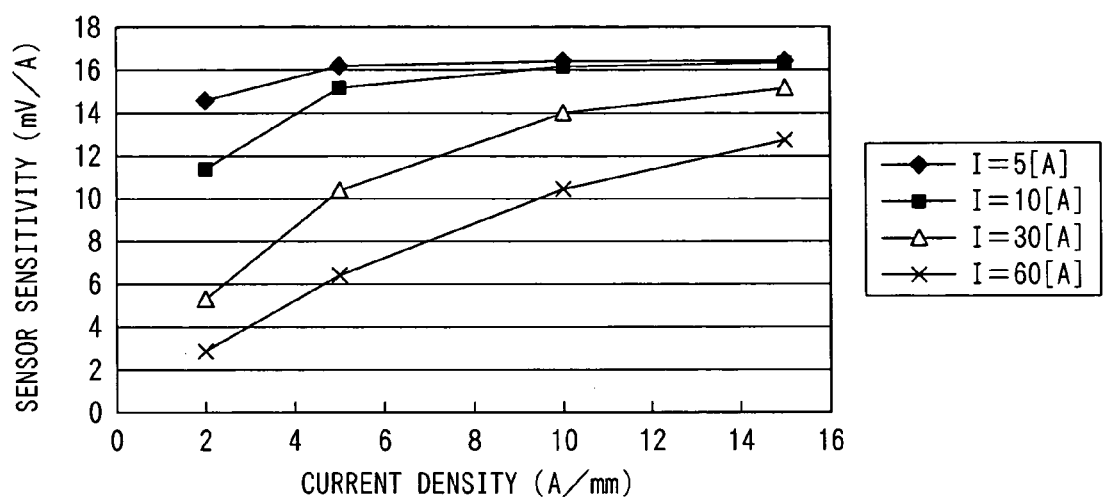
FIG. 12 is a graph that shows how the sensor sensitivity of the current sensor 100 changes when the current density of the conductor for measurement 4 is changed.

FIG. 12 is a graph that shows how the sensor sensitivity of the current sensor 100 changes when the current density of the conductor for measurement 4 is changed. However, the results of FIG. 12 were obtained when the thickness of the printed board 3 was 1.6 mm and the value of a current flowing through the conductor for measurement 4 was constant (I=5, 10, 30 and 60 A).

As shown in the results of FIG. 5 to FIG. 10, in order to improve sensor sensitivity, it is desirable to minimize the width W of the conductor for measurement 4 as far as possible. However, the conductor for measurement 4, which is generally formed from a 35 μm thick copper sheet, is designed on the basis of 1 A maximum as the value of a current capable of being caused to flow for each 1 mm in width. This is because problems due to heat generation were taken into consideration. That is, in some current quantities, it is impossible to reduce the width W of the conductor for measurement 4 more than is necessary. When the width W of the conductor for measurement 4 is reduced, it is necessary to increase the thickness of the conductor for measurement 4 in order to avoid the problems of heat generation. As shown in the results of FIG. 12, sensor sensitivity is not increased so much even when the current density is increased to not less than 15 A/mm, independent of the measuring current range. In order to ensure a current density of 15 A/mm when a current of $I_{max}$ (A) maximum is caused to flow, it is necessary that the width of the conductor for measurement 4 be $I_{max}/15$ mm.

Therefore, if the maximum current value is 60 A, then it is appropriate that the width W of the conductor for measurement 4 be about 4 mm. In this case, however, it is necessary that the thickness of the conductor for measurement 4 be increased to not less than 15 times the value of 35 μm. If the thickness of the conductor for measurement 4 is about 500 μm to 1 mm, then the width W of the conductor for measurement 4 is 4 to 5 mm in order to measure a current of about 60 A with good sensor sensitivity. Because sensor sensitivity is improved when the width W of the conductor for measurement 4 in such a range like this, it is possible to measure a current flowing through the conductor for measurement 4 with higher accuracy.

When the current sensor 100 is used, a current density of 15 A/mm is necessary as a current flowing through the conductor for measurement 4 in order to obtain a sensor sensitivity of 15 mV/A. In order to ensure a current density of 15 A/mm when a current of $I_{max}$ (A) maximum is caused to flow, it is necessary that the width of the conductor for measurement 4 be $I_{max}/15$ mm. However, it is necessary that the thickness of the conductor for measurement 4 be not less than 35 μm×15 at the lowest. Because a decrease in sensor sensitivity becomes small when the thickness is as small as possible, it is preferred that the thickness be not less than 0.5 mm but not more than 1 mm. Therefore, when a current of several tens of amperes is considered, it is appropriate that the shape of the conductor for measurement 4 be such that the width is not more than $I_{max}/15$ mm, the length is not less than 10 mm and the thickness is not more than 1.0 mm when the maximum current is $I_{max}$ (A).

Thus, in this embodiment, the printed board 3 having the conductor for measurement 4 and the noncontact type current sensor 100 to be mounted on the surface of the printed board 3 are provided, and the current sensor 100 is mounted on the rear surface 92.

As a result, because the current sensor 100 is mounted on the rear surface 92, electric insulation can be relatively easily ensured between the secondary side conductor of the current sensor 100 and the conductor for measurement 4 compared to conventional techniques. Also, because a current flowing through the conductor for measurement 4 is measured in a noncontact manner, it is unnecessary to increase the size of the current sensor 100 even when the current flowing through the conductor for measurement 4 becomes large. Therefore, the miniaturization of the current sensor 100 can be performed. Furthermore, because a current flowing through the conductor for measurement 4 is measured in a noncontact manner, heat generation due to contact with the conductor for measurement 4 does not occur. Therefore, the possibility that the reliability of the current sensor 100 may be impaired can be reduced compared to conventional techniques.

In a conventional current sensor in which a conductor for measurement 4 is built, in order to measure a current with high accuracy, it was necessary to monolithically mold a primary conductor and the magnetic sensor or to perform calibration after assembling so that a deviation of position does not occur between the primary conductor and the magnetic sensor. In particular, when a magnetic sensor that needs to use a bias magnet is used, in order to accurately measure a current, it was necessary to sufficiently ensure the position accuracy of component parts such a the bias magnet, primary conductor and magnetic sensor, and to further perform calibration due to the effects of the characteristics of the bias magnet, variations in the sensitivity of the magnetic sensor, etc. When a current sensor is mounted on the same surface as the surface provided with a conductor for measurement 4 of a printed board 3, it was necessary to select the mounting place, because mounting on a pattern becomes impossible due to the problems of the package size and package type (SOP, QFP, QFN, BGA, etc.) when the width of the conductor for measurement 4 is large and because current sensitivity changes greatly depending on the mounting position.

Finding out that the current measuring method and the current measuring device according to the invention are very effective in solving these problems, the present inventors could realize the current measuring method and the current measuring device. In rear surface mounting, there is no position restriction by package size or package type and a current sensitivity that changes gently in a wide area and is relatively uniform is obtained. In addition, by using a current sensor that detects magnetic fields parallel to the surface of the board on which the current sensor is mounted with good accuracy without hysteresis and the like, it has become possible to realize sufficient accuracy even without the calibration of current sensitivity. It can be said that as a result of this, the degree of freedom related to the mounting position has become wide and that users of the current sensor has obtained a large degree of freedom in designing circuits on the printed board 3.

Furthermore, in this embodiment, the current sensor 100 is mounted on the rear surface 92 and in a position symmetrical to the conductor for measurement 4 with respect to the printed board 3.

As a result of this, because the current sensor 100 is mounted on the rear surface 92 and in a position symmetrical to the conductor for measurement 4 with respect to the printed board 3, it becomes easy to detect a magnetic flux generated by the current flowing through the conductor for measurement 4 by use of the current sensor 100 and it is possible to reduce the possibility that the reliability of the current sensor 100 may be impaired even when the sensor 100 is mounted from the opposite side of the printed board 3 with respect to the conductor for measurement 4.

Furthermore, in this embodiment, the current sensor 100 comprises the Hall element 9 that detects magnetic fields and the magnetic flux concentrating plate 11 that concentrates a magnetic flux in a predetermined direction, the Hall element 9 is provided on the exterior surface of the current sensor 100 on the side that faces the side of the surface of the printed board 3 upon mounting, and the magnetic flux concentrating plates 11 is provided so that the magnetic flux generated by the current flowing through the conductor for measurement 4 is concentrated on the magnetic flux sensing surface of the Hall element 9.

As a result of this, because the magnetic flux generated by the current flowing through the conductor for measurement 4 is easily concentrated on the magnetic flux sensing surface of the Hall element 9, it is possible to reduce the possibility that the reliability of the current sensor 100 may be impaired even when the sensor 100 is mounted from the opposite side of the printed board 3 with respect to the conductor for measurement 4. Also, because the current sensor 100 can be manufactured by the same technique as the usual LSI process and a current flowing through the conductor for measurement 4 can be measured in a noncontact manner, miniaturization can be performed. At the same time, it is possible to measure a current flowing through the conductor for measurement 4, including the direction of the current, with relatively high accuracy. Furthermore, because the Hall element 9 and the magnetic flux concentrating plate 11 can be manufactured by the same technique as the usual LSI process, it is possible to increase production efficiency. Furthermore, because the primary side conductor is not built in the same package, it is unnecessary to leave a space in the conductor pattern of the printed board 3 and to mount the primary side conductor in series there, making the size relatively small. In addition, because current can be measured indirectly from above the conductor pattern, the modification and change of the conductor pattern are unnecessary even when parts are removed after design, and it is relatively easy to stop mounting.

Furthermore, in this embodiment, the current sensor 100 integrally incorporates the Hall element 9 and the magnetic flux concentrating plate 11, and the magnetic flux concentrating plate 11 is provided between the Hall element 9 and the facing surface 90.

As a result of this, because the magnetic flux generated by the current flowing through the conductor for measurement 4 can be effectively concentrated on the magnetic flux sensing surface of the Hall element 9, it is possible to reduce the possibility that the reliability of the current sensor 100 may be impaired even when the sensor 100 is mounted on the opposite side of the printed board 3 with respect to the conductor for measurement 4.

Furthermore, in this embodiment, multiple magnetic flux concentrating plates are spaced in such a manner that when the current sensor 100 is mounted, surfaces of the magnetic flux concentrating plates 11 face the surface of the printed board 3 and the multiple magnetic flux concentrating plates 11 are positioned on both sides of a centerline of the conductor for measurement 4 as viewed from the direction perpendicular to the plane of the printed board 3.

As a result of this, because the magnetic flux generated by the current flowing through the conductor for measurement 4 can be more effectively concentrated on the magnetic flux sensing surface of the Hall element 9, it is possible to reduce the possibility that the reliability of the current sensor 100 may be impaired even when the sensor 100 is mounted on the opposite side of the printed board 3 with respect to the conductor for measurement 4.

In the above-described first embodiment, the magnetic flux concentrating plate 11 corresponds to the magnetic flux concentrating means described in claim 1, claim 6, claim 7, claim 10, claim 15 or claim 16.

Figure 13:
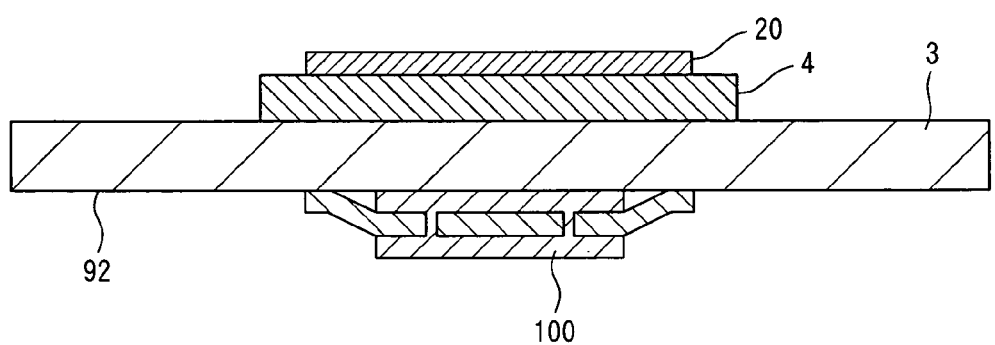
FIG. 13 is a sectional view of a current sensor 100 in the thickness direction.

Next, the second embodiment of the invention will be described by referring to a drawing. FIG. 13 is a drawing that shows the second embodiment of the current measuring method and current measuring device related to the invention. In the following, descriptions will be given only of parts that differ from the first embodiment and the description of overlapping parts will be omitted by giving like numerals to such parts.

First, the construction of the current measuring device related to the invention will be described by referring to FIG. 13. FIG. 13 is a sectional view of a current sensor 100 in the thickness direction.

As shown in FIG. 13, the current measuring device related to the invention comprises a printed board 3 having a conductor for measurement 4 and a current sensor 100 that is mounted on a rear surface 92 and in a position on the side that is opposite to the conductor for measurement 4, with the printed board 3 positioned between the two, and a soft magnetic material 20 in the shape of a thin sheet is provided on an exterior surface of the conductor for measurement 4 on the side that is opposite to an exterior surface facing the printed board 3. For the soft magnetic material 20, the smaller the remanence, the better.

According to this construction, the magnetic field that is generated by the current flowing through the conductor for measurement 4 and radiates to the side opposite to the current sensor 100 as viewed from the conductor for measurement 4, becomes easily concentrated to the side of the current sensor 100. Also, the soft magnetic material 20 is effective in reducing the effect of a disturbance magnetic field other than the magnetic fields generated by the conductor for measurement 4.

Thus, in this embodiment, a soft magnetic material 20 is provided on the exterior surface of the conductor for measurement 4 that is opposite to the exterior surface thereof facing the printed board 3.

As result of this, the magnetic flux generated by the current flowing through the conductor for measurement 4 can be effectively concentrated by the soft magnetic material 20 on the side of the current sensor 100, it is possible to improve sensor sensitivity and to reduce a disturbance magnetic field even the sensor 100 is mounted from the opposite side of the printed board 3 with respect to the conductor for measurement 4.

Figure 14:
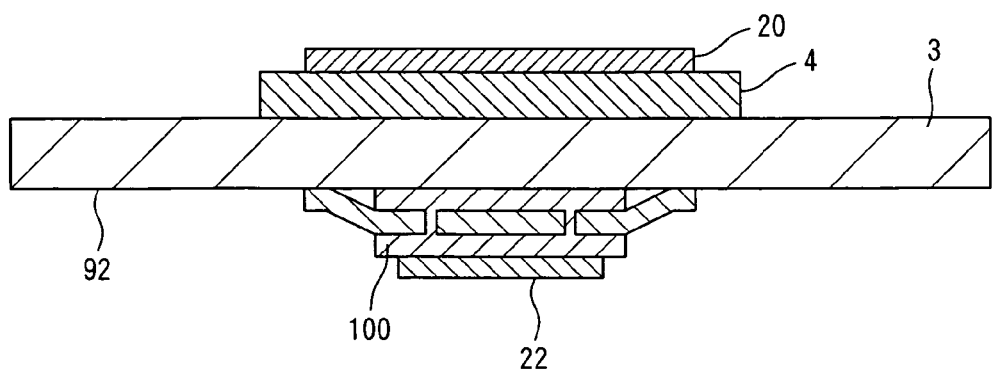
FIG. 14 is a sectional view of a current sensor 100 in the thickness direction.

Next, the third embodiment of the invention will be described by referring to a drawing. FIG. 14 is a drawing that shows the third embodiment of the current measuring method and current measuring device related to the invention. In the following, descriptions will be given only of parts that differ from the first embodiment and the description of overlapping parts will be omitted by giving like numerals to such parts.

First, the construction of the current measuring device related to the invention will be described by referring to FIG. 14. FIG. 14 is a sectional view of a current sensor 100 in the thickness direction.

As shown in FIG. 14, the current measuring device related to the invention comprises a printed board 3 having a conductor for measurement 4 and a current sensor 100 that is mounted on a rear surface 92 and in a position on the side that is opposite to the conductor for measurement 4, with the printed board 3 positioned between the two, and a soft magnetic material 20 in the shape of a thin sheet is provided on an exterior surface of the conductor for measurement 4 on the side that is opposite to an exterior surface facing to the printed board 3. And at the same time, a soft magnetic material 22 in the shape of a thin sheet is provided on an exterior surface of the current sensor 100 on the side that is opposite to an exterior surface facing to the printed board 3. For the soft magnetic materials 20, 22, the smaller the remanence, the better.

According to this construction, external magnetic fields that come toward an exterior surface of the current sensor 100 on the side that is opposite to an exterior surface facing to the printed board 3 great least shielded by the soft magnetic material 22. Also, owing to the soft magnetic material 20 the magnetic field that is generated by the current flowing through the conductor for measurement 4 and radiates to the side opposite to the current sensor 100 as viewed from the conductor for measurement 4, becomes easily concentrated on the side of the current sensor 100.

Next, the first example related to the invention will be described.

As a technique for reducing the effect of a disturbance magnetic field, a soft magnetic material 22 was mounted on a surface of a mold package 1 as shown in FIG. 14. By performing magnetic shielding, a disturbance magnetic field was caused to concentrate in the plane direction of the soft magnetic material 22 in order to reduce the effect of a disturbance magnetic field on a Hall element 9. The soft magnetic material 22 used has a size of 4×4×0.15 mm and is formed from 78.7% Ni permalloy. The greatest problem is the effect of a disturbance magnetic field from above the mold package 1. An investigation was made into the effect of a current conductor 5 cm above the mold package 1, and the effect of a disturbance magnetic field could be reduced to ⅓ the level observed in a case where the soft magnetic material 22 is not provided. An investigation was made into the effect of a current conductor 8 cm above the mold package 1, and the effect of a disturbance magnetic field could be reduced to ⅕ the level observed in a case where the soft magnetic material 22 is not provided.

Next, the second example related to the invention will be described.

Although in the current measuring method of the above-described first example, the effect of a disturbance magnetic field can be reduced by magnetic shielding, the mounting of the soft magnetic material 22 reduces also sensor sensitivity itself to the conductor for measurement 4, which should essentially be measured. The decrease in sensor sensitivity can also be suppressed if the soft magnetic material 22 is spaced by not less than about 1 mm from the Hall element 9. However, because the TSSOP-16 package was used for miniaturization, the distance between the Hall element 9 and the soft magnetic material 22 became about 0.7 mm and in the above-described first example, the decrease in sensor sensitivity was down about 50% compared with a case where the soft magnetic material 22 is not provided.

For this reason, an improvement of sensor sensitivity was examined. In order to improve sensor sensitivity by causing a magnetic flux generated by a current flowing through a conductor 4 to be measured to be concentrated satisfactorily, a soft magnetic material 20, which has a size of 10×7×0.4 mm and is formed from 78.7% Ni permalloy, was stuck to a conductor for measurement 4 with an adhesive so that by bringing a soft magnetic material 22 close to the conductor 4 to be measured thereby to ensure arrangement that enables the magnetic flux to concentrate on a current sensor 100 with good efficiency. The arrangement of the soft magnetic material 20 can be carried out in the same manner as in the above-described second embodiment. When the soft magnetic material 20 was provided, sensor sensitivity could be improved by about 50% compared with initial sensor sensitivity. When the size of the soft magnetic material 20 was increased to 20×20×1 mm, sensor sensitivity improved 80%. Even when the soft magnetic material 22 was provided, sensor sensitivity, which had been down 50%, was improved to down 10% to 20%.

Thus, in this embodiment, the soft magnetic material 22 is provided on an exterior surface of the current sensor 100 on the side that is opposite to an exterior surface facing to the printed board 3.

As a result of this, because external magnetic fields that come toward an exterior surface of the current sensor 100 on the side that is opposite to an exterior surface facing to the printed board 3 are at least shielded by the soft magnetic material 22, it is possible to improve the resistance to external magnetic fields.

Furthermore, in this embodiment, a soft magnetic material 20 is provided on an exterior surface of the conductor for measurement 4 on the side that is opposite to an exterior surface facing to the printed board 3.

As a result of this, because the magnetic flux generated by a current flowing through the conductor for measurement 4 can be effectively concentrated by the soft magnetic material 20 to the side of the current sensor 100, it is possible to reduce the possibility that sensor sensitivity may be impaired even when the sensor 100 is mounted on the opposite side of the printed board 3 with respect to the conductor for measurement 4.

Figure 15:
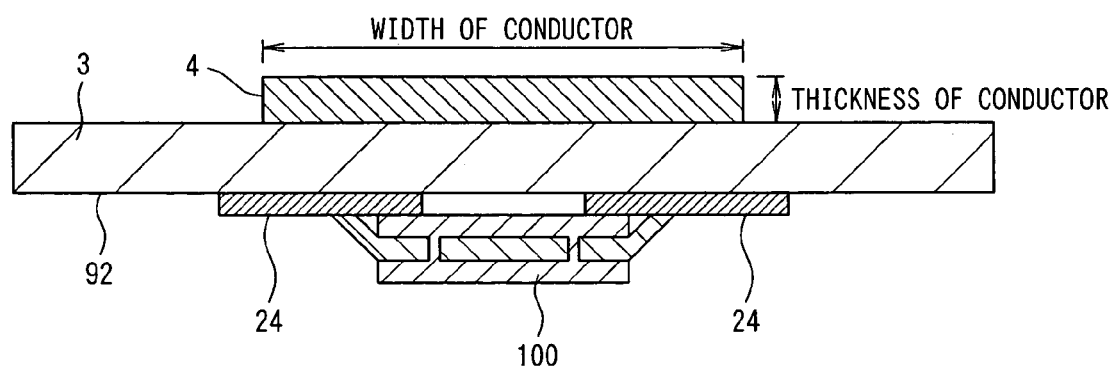
FIG. 15 is a sectional view of a current sensor 100 in the thickness direction.

Next, the fourth embodiment of the invention will be described by referring to a drawing. FIG. 15 is a drawing that shows the fourth embodiment of the current measuring method and current measuring device related to the invention. In the following, descriptions will be given only of parts that differ from the first embodiment and the description of overlapping parts will be omitted by giving like numerals to such parts.

First, the construction of the current measuring device related to the invention will be described by referring to FIG. 15. FIG. 15 is a sectional view of a current sensor 100 in the thickness direction.

As shown in FIG. 15, the current measuring device related to the invention comprises a printed board 3 having a conductor for measurement 4 and a current sensor 100 that is mounted on a rear surface 92 and in a position on the side that is opposite to the conductor for measurement 4, with the printed board 3 positioned between the two, and between the current sensor 100 and the printed board 3, there are provided multiple soft magnetic materials 24 so as to be parallel to the direction of a current flowing through the conductor for measurement 4. For the soft magnetic material 24, the smaller the remanence, the better.

According to this construction, the magnetic flux generated by a current flowing through the conductor for measurement 4 can be easily concentrated by the multiple soft magnetic materials 24 on the side of the current sensor 100.

Next, an example related to the invention will be described.

In order to further increase sensor sensitivity, the soft magnetic material 24 was mounted between the current sensor 100 and the printed board 3 as shown in FIG. 15. The soft magnetic material 22 used has a size of 4×4×0.15 mm and is formed from 78.7% Ni permalloy. The number of the soft magnetic materials was two. With the gap between the two being 2 mm, the two soft magnetic materials were bonded to the underside of the mold package 1 having a width of 5 mm. As a result, the initial sensor sensitivity could be improved about 40%.

When Ni permalloy having a size of 20×20×1 mm was mounted on the side of the conductor for measurement 4, sensor sensitivity could be improved to about 210%.

Thus, in this embodiment, between the current sensor 100 and the printed board 3, there are provided multiple soft magnetic materials 24 so as to be parallel to the direction of a current flowing through the conductor for measurement 4.

As a result of this, because the magnetic flux generated by a current flowing through the conductor for measurement 4 can be effectively concentrated by the soft magnetic material 24 to the side of the current sensor 100, it is possible to reduce the possibility that sensor sensitivity may be impaired even when the sensor 100 is mounted from the opposite side of the printed board 3 with respect to the conductor for measurement 4.

Figure 16:
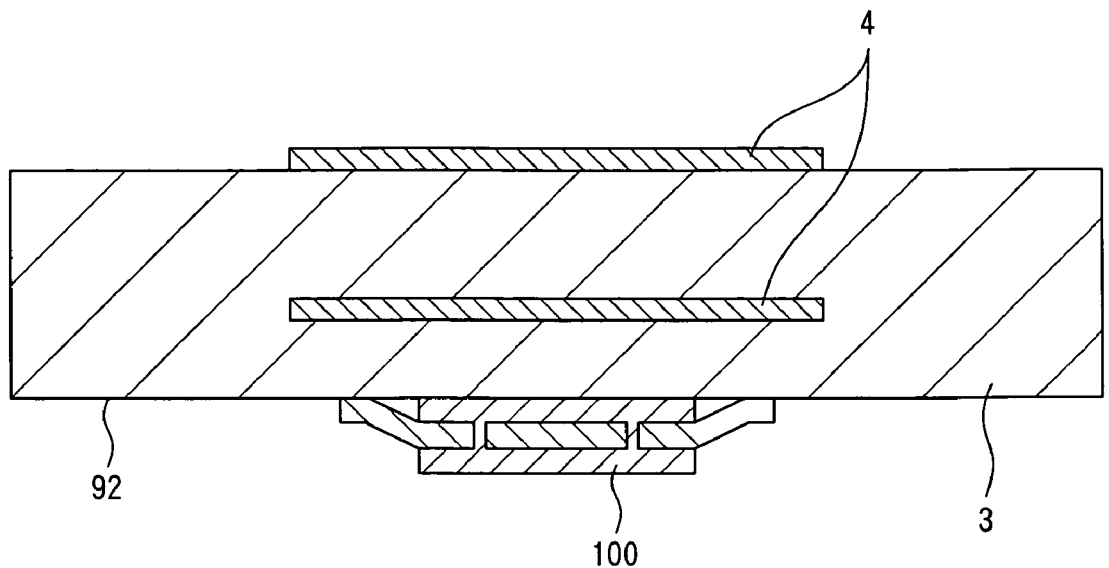
FIG. 16 is a sectional view of a current sensor 100 in the thickness direction.

Next, the fifth embodiment of the invention will be described by referring to a drawing. FIG. 16 is a drawing that shows the fifth embodiment of the current measuring method and current measuring device related to the invention. In the following, descriptions will be given only of parts that differ from the first embodiment and the description of overlapping parts will be omitted by giving like numerals to such parts.

First, the construction of the current measuring device related to the invention will be described by referring to FIG. 16. FIG. 16 is a sectional view of a current sensor 100 in the thickness direction.

As shown in FIG. 16, the current measuring device related to the invention comprises a printed board 3 having a conductor for measurement 4 and a current sensor 100 that is mounted on a rear surface 92 and in a position on the side that is opposite to the conductor for measurement 4, with the printed board 3 positioned between the two. The current sensor 100 is mounted in a position where the distance to each of the multiple conductors to be measured 4 is in a predetermined relation.

The printed board 3 has a four-layer structure obtained by laminating an insulating layer, a wiring layer, an insulating layer and a wiring layer in this order, and in the wiring layers the conductors to be measured 4 are formed parallel.

Incidentally, to the current sensor 100 is connected an arithmetic circuit (not shown) that measures currents flowing through each of the multiple conductors to be measured 4 on the basis of sensor signals from the current sensor 100. The arithmetic circuit inputs sensor signals from the current sensor 100 and calculates the value of a current flowing through each of the multiple conductors to be measured 4 by arithmetic operation on the basis of the input sensor signals and the positional relationship between the current sensor 100 and each of the multiple conductors to be measured 4.

According to this construction, the current sensor 100 is mounted in a position where the distance to each of the conductors to be measured 4 is in a predetermined relation and, therefore, when the current sensor 100 receives the magnetic field generated by a current flowing through each of the conductors to be measured 4, the arithmetic circuit can calculate the value of a current flowing through each of the multiple conductors to be measured 4 by arithmetic operation on the basis of the sensor signals from the current sensor 100 and the positional relationship between the current sensor 100 and each of the multiple conductors to be measured 4.

Next, an example related to the invention will be described.

In the current measuring methods of the above-described first to fourth modes of embodiment, current is measured by transducing weak magnetic fields formed by a current flowing through the conductor for measurement 4 and, therefore, it is possible to measure a current that spreads through a relatively wide space that is 10 cm square in addition to a current flowing through the conductor for measurement 4. Paying attention to this, the present inventors examined measuring each of the currents flowing through multiple conductors to be measured 4 by use of one current sensor 100.

As shown in FIG. 16, in a four-layer printed board 3 that is formed from a 35 μm wide inner layer and a 175 μm wide outer layer and has a total board thickness of 3.2 mm, two 15 mm wide conductors to be measured 4 through which different currents are caused to flow were formed parallel to each other, and a current sensor 100 similar to that of the above-described first example was mounted on the rear surface 92 of the printed board. At this time, the current sensor 100 is mounted in a position where the distance from each of the conductors to be measured 4 is in a predetermined relation. The distance to the Hall element 9 is about 1 mm for one conductor for measurement 4 and about 3.2 mm for the other conductor for measurement 4. At this time, the sensor sensitivity that gives each of the conductors to be measured 4 was 50.4 mV/A and 43.2 mV/A, respectively.

An AC current having a frequency of 50 Hz and an amplitude of 10 A was caused to flow through one conductor for measurement 4, and a square-wave current having a frequency of 1 Hz and an amplitude of 10 A was caused to flow through the other conductor for measurement 4. Then, an output very close to a theoretical vale as expected could be taken from the current sensor 100. By subjecting sensor signals to analog signal processing or digital signal processing, it is possible to separate two signals. Therefore, it is possible to measure the currents that flow the two conductors to be measured 4 by use of the current sensor 100.

Thus, in this embodiment, the printed board 3 has multiple conductors to be measured 4 and the current sensor 100 is mounted in a position where the distance to each of the multiple conductors to be measured 4 is in a predetermined relation.

As a result of this, the current sensor 100 is mounted in a position where the distance to each of the multiple conductors to be measured 4 is in a predetermined relation and, therefore, when the current sensor 100 receives the magnetic field generated by a current flowing through each of the conductors to be measured 4, the arithmetic circuit can calculate the value of a current flowing through each of the multiple conductors to be measured 4 by arithmetic operation on the basis of the sensor signals from the current sensor 100 and the positional relationship between the current sensor 100 and each of the multiple conductors to be measured 4.

Incidentally, in the above-described fifth embodiment, in a case where two conductors to be measured 4 are formed in the thickness direction of the printed board 3, the current sensor 100 is mounted on the rear surface 92 and in a position on the side that is opposite to the side of the conductors to be measured 4, with the printed board 3 being positioned between the conductors to be measured and the current sensor. However, the mounting of the current sensor is not limited to this, and as shown in FIG. 17, in a case where multiple conductors to be measured 4 are formed in the plane direction of the printed board 3, the current sensor 100 may be mounted on the rear surface 92 and in a position near the conductors to be measured 4.

Figure 17:
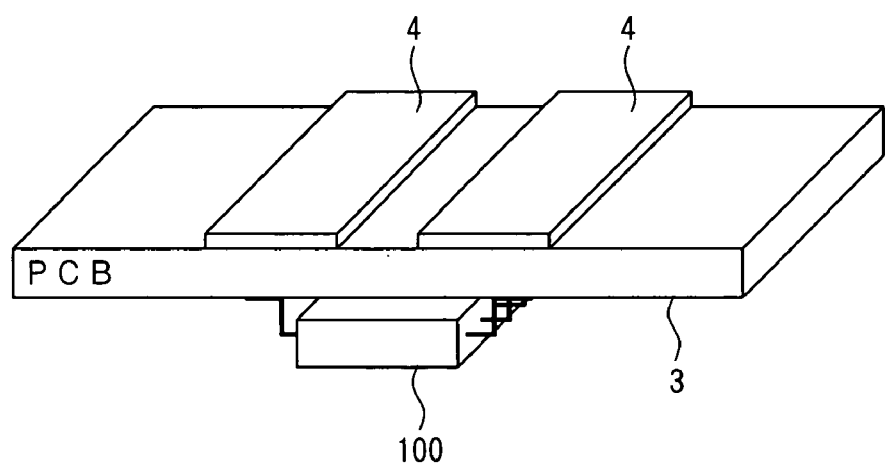
FIG. 17 is a perspective view of a current sensor 100 mounted on the rear surface of a printed board 3.

FIG. 17 is a perspective view of the current sensor 100 mounted on the rear surface of the printed board 3.

INDUSTRIAL APPLICABILITY

As described above, according to the current measuring method described in claims 1 to 9 related to the invention or the current measuring device described in claims 10 to 20, the current sensor is mounted on the surface of the board on the side that is opposite to the side provided with the conductor for measurement, and this provides the advantage that electrical insulation can be relatively easily ensured between the secondary side conductor of the current sensor and the conductor for measurement compared to conventional techniques. Also, measuring a current flowing through the conductor for measurement in a noncontact manner makes it unnecessary to increase the size of the current sensor even when a current flowing through the conductor for measurement becomes large. This provides also the advantage that the size of the current conductor can be reduced. Furthermore, measuring a current flowing through the conductor for measurement in a noncontact manner does not cause heat generation due to resistance of contact with the conductor for measurement and this also provides the advantage that it is possible to reduce the possibility that the reliability of the current sensor may be impaired compared to conventional techniques. Furthermore, the current sensor is mounted on the surface of the board on the side that is opposite to the side provided with the conductor for measurement, and this provides also the advantage that it is possible to detect uniform magnetic fields generated by a current flowing through the conductor for measurement by use of the current sensor. In addition, due to magnetic flux concentrating means a magnetic flux generated by a current flowing through the conductor for measurement becomes easily concentrated on the magnetic flux sensing surface of the Hall element, and this also provides the advantage that sensor sensitivity can be improved by mounting the current sensor from the opposite side of the board with respect to the conductor for measurement.

Furthermore, according to the current measuring method described in claim 2 or the current measuring device described in claim 11, the current sensor is mounted on the surface of the board on the side that is opposite to the side provided with the conductor for measurement and in a position symmetrical to the conductor for measurement with respect to the board, and this provides also the advantage that magnetic fields generated by a current flowing through the conductor for measurement are more easily detected by the current sensor and the advantage that it is possible to further reduce the possibility that sensor sensitivity may be impaired even when the current sensor is mounted on the opposite side of the board with respect to the conductor for measurement.

Furthermore, according to the current measuring method described in claim 3 or the current measuring device described in claim 12, a magnetic flux generated by a current flowing through the conductor for measurement can be effectively concentrated on the side of the current sensor by the soft magnetic material provided on an exterior surface of the conductor for measurement on the side that is opposite to an exterior surface facing the surface of the board, and this provides also the advantage that it is possible to reduce the possibility that sensor sensitivity may be impaired even when the current sensor is mounted from the opposite side of the board with respect to the conductor for measurement.

Furthermore, according to the current measuring method described in claim 4 or the current measuring device described in claim 13, the soft magnetic material provided on an exterior surface of the current sensor on the side that is opposite to an exterior surface facing the surface of the board, shields at least the external magnetic fields that reach toward this exterior surface of the current sensor on the opposite side, and this provides also the advantage that it is possible to improve the resistance to external magnetic fields compared to conventional techniques.

Furthermore, according to the current measuring method described in claim 5 or the current measuring device described in claim 14, a magnetic flux generated by the conductor for measurement can be effectively collected to the side of the current sensor by the multiple soft magnetic materials provided between the current sensor and the board, and this provides also the advantage that it is possible to reduce the possibility that sensor sensitivity may be impaired even when the current sensor is mounted from the opposite side of the board with respect to the conductor for measurement.

Furthermore, according to the current measuring method described in claims 6 to 8 or the current measuring device described in claims 15 to 17, a magnetic flux generated by a current flowing through the conductor for measurement can be effectively concentrated on the magnetic flux sensing surface of the Hall element, and this provides also the advantage that it is possible to further reduce the possibility that sensor sensitivity may be impaired even when the current sensor is mounted from the opposite side of the board with respect to the conductor for measurement.

Furthermore, according to the current measuring method described in claims 7 and 8 or the current measuring device described in claims 16 and 17, a magnetic flux generated by a current flowing through the conductor for measurement can be more effectively concentrated on the magnetic flux sensing surface of the Hall element, and this provides also the advantage that it is possible to further reduce the possibility that sensor sensitivity may be impaired even when the current sensor is mounted from the opposite side of the board with respect to the conductor for measurement.

On the other hand, according to the current measuring device described in claims 10 to 20, owing to the magnetic flux concentrating means a magnetic flux generated by a current flowing through the conductor for measurement is easily concentrated on the magnetic flux sensing surface of the Hall element and this provides also the advantage that it is possible to reduce the possibility that sensor sensitivity may be impaired even when the current sensor is mounted from the opposite side of the board with respect to the conductor for measurement. Also, the current sensor can be manufactured by techniques similar to the usual LSI process and a current in the conductor for measurement can be measured in a noncontact manner, and this provides also the advantage that miniaturization is possible and the advantage that a current in the conductor for measurement, including the direction of the current, can be measured with relatively high accuracy while keeping electric insulation between the conductor for measurement and the current sensor and suppressing heat generation. Furthermore, the Hall element and magnetic flux concentrating means can be manufactured by techniques similar to the usual LSI process, and this provides also the advantage that production efficiency can be increased. Furthermore, the primary side conductor is not built in the same package, and this provides also the advantage that it is unnecessary to leave a space in the conductor pattern of the board and to mount the primary side conductor in series there, and this provides also the advantage that the size can be made relatively small. In addition, because current can be measured indirectly from above the conductor pattern, the modification and change of the conductor pattern are unnecessary even when parts are removed after design, and this provides also the advantage that it is relatively easy to stop mounting.

Furthermore, according to the current measuring device described in claim 18, the current sensor is mounted in a position where the distance from each of the conductors to be measured is in a predetermined relation. Therefore, this provides also the advantage that when a magnetic field generated by a current flowing through each of the conductors to be measured is received by the current sensor, the current flowing through each of the conductors to be measured can be measured on the basis of an output value of the current sensor and the predetermined relation.

The invention claimed is:

1. A current measuring method comprising mounting a current sensor on a board having a conductor for measurement and measuring a current flowing through said conductor for measurement, wherein said current sensor is mounted on a surface of said board on the side that is opposite to the side provided with said conductor for measurement, said current sensor has a Hall element that detects magnetic fields and magnetic flux concentrating means that causes a magnetic flux to be concentrated in a predetermined direction, and said magnetic flux concentrating means is provided in such a manner that a magnetic flux generated by a current flowing through said conductor for measurement is concentrated on a magnetic flux sensing surface of said Hall element.

2. The current measuring method according to claim 1, wherein said current sensor is mounted on a surface of said board on the side that is opposite to the side provided with said conductor for measurement and in a position symmetrical to said conductor for measurement with respect to said board.

3. The current measuring method according to either claim 1 or claim 2, wherein a soft magnetic material is provided on an exterior surface of said conductor for measurement on the side that is opposite to an exterior surface facing the surface of said board.

4. The current measuring method according to either claim 1 or claim 2, wherein a soft magnetic material is provided on an exterior surface of said current sensor on the side that is opposite to an exterior surface facing the surface of said board.

5. The current measuring method according to either claim 1 or claim 2, wherein between said current sensor and said board, there are provided multiple soft magnetic materials so as to be parallel to the direction of a current flowing through said conductor for measurement.

6. The current measuring method according to claim 1, wherein said current sensor integrally incorporates said Hall element and said magnetic flux concentrating means and said magnetic flux concentrating means is provided between said Hall element and said facing surface.

7. The current measuring method according to claim 6, wherein said magnetic flux concentrating means comprises multiple magnetic flux concentrating plates and is provided in such a manner that when said current sensor is mounted, surfaces of said magnetic flux concentrating plates are facing the surface of said board.

8. The current measuring method according to claim 7, wherein said multiple magnetic flux concentrating plates are spaced in such a manner that when said current sensor is mounted, surfaces of said magnetic flux concentrating plates are opposite to the surface of said board and said multiple magnetic flux concentrating plates are positioned on both sides of a centerline of said conductor for measurement as viewed from the direction perpendicular to the plane of said board.

9. The current measuring method according to claim 1, wherein said conductor for measurement is a printed wiring and said board is a printed board.

10. A current measuring device, comprising a board having a conductor for measurement and a current sensor mounted on the surface of said board, that measures a current flowing through said conductor for measurement, wherein said current sensor is mounted on the surface of said board on the side that is opposite to the side provided with said conductor for measurement, said current sensor has a Hall element that detects magnetic fields and magnetic flux concentrating means that concentrates a magnetic flux in a predetermined direction, and said magnetic flux concentrating means is provided in such a manner that a magnetic flux generated by a current flowing through said conductor for measurement is concentrated on a magnetic flux sensing surface of said Hall element.

11. The current measuring device according to claim 10, wherein said current sensor is mounted on the surface of said board on the side that is opposite to the side provided with said conductor for measurement and in a position symmetrical to said conductor for measurement with respect to said board.

12. The current measuring device according to either claim 10 or claim 11, wherein a soft magnetic material is provided on an exterior surface of said conductor for measurement on the side that is opposite to the side of an exterior surface facing the surface of said board.

13. The current measuring device according to either claim 10 or claim 11, wherein a soft magnetic material is provided on an exterior surface of said current sensor on the side that is opposite to an exterior surface facing the surface of said board.

14. The current measuring device according to either claim 10 or claim 11, wherein between said current sensor and said board, there are provided multiple soft magnetic materials so as to be parallel to the direction of a current flowing through said conductor for measurement.

15. The current measuring device according to either claim 10 or claim 11, wherein said current sensor integrally incorporates said Hall element and said magnetic flux concentrating means and said magnetic flux concentrating means is provided between said Hall element and said facing surface.

16. The current measuring device according to claim 15, wherein said magnetic flux concentrating means comprises multiple magnetic flux concentrating plates and is provided in such a manner that when said current sensor is mounted, surfaces of said magnetic flux concentrating plates are facing the surface of said board.

17. The current measuring device according to claim 16, wherein said multiple magnetic flux concentrating plates are spaced in such a manner that when said current sensor is mounted, surfaces of said magnetic flux concentrating plates are opposite to the surface of said board and said multiple magnetic flux concentrating plates are positioned on both sides of a centerline of said conductor for measurement as viewed from the direction perpendicular to the plane of said board.

18. The current measuring device according to claim 10, wherein said board has multiple conductors to be measured and said current sensor is mounted in a position where the distance of said board from each of said conductors to be measured is in a predetermined relation.

19. The current measuring device according to claim 10, wherein said conductor for measurement is a printed wiring and said board is a printed board.

20. The current measuring device according to claim 10, wherein a magnetic flux sensing part of said Hall element is formed from Si, GaAs, InAs or InSb.

* * * * *